United States Patent
Takaki et al.

(10) Patent No.: US 8,432,105 B2
(45) Date of Patent: Apr. 30, 2013

(54) LIGHT CONTROL APPARATUS FOR LIGHTING AN ORGANIC ELECTROLUMINESCENCE DEVICE AND LIGHTING APPLIANCE USING THE SAME

(75) Inventors: Hirofumi Takaki, Aichi (JP); Shin Ukegawa, Kyoto (JP); Minoru Maehara, Osaka (JP); Hirofumi Konishi, Osaka (JP); Masanao Okawa, Nara (JP)

(73) Assignee: Panasonic Corporation, Osaka (JP)

( * ) Notice: Subject to any disclaimer, the term of this patent is extended or adjusted under 35 U.S.C. 154(b) by 333 days.

(21) Appl. No.: 12/679,688

(22) PCT Filed: Sep. 24, 2008

(86) PCT No.: PCT/JP2008/067190
§ 371 (c)(1), (2), (4) Date: May 11, 2010

(87) PCT Pub. No.: WO2009/041437
PCT Pub. Date: Apr. 2, 2009

(65) Prior Publication Data
US 2010/0244704 A1    Sep. 30, 2010

(30) Foreign Application Priority Data

Sep. 25, 2007 (JP) ................. 2007-248161

(51) Int. Cl.
*G05F 1/00* (2006.01)
*H05B 37/02* (2006.01)
*H05B 39/04* (2006.01)
*H05B 41/36* (2006.01)
*H05B 37/00* (2006.01)
*H05B 39/02* (2006.01)
*H05B 41/00* (2006.01)
*H05B 41/14* (2006.01)

(52) U.S. Cl.
USPC ..... 315/291; 315/119; 315/200 R; 315/209 R

(58) Field of Classification Search .................. None
See application file for complete search history.

(56) References Cited

U.S. PATENT DOCUMENTS 7,470,957 B2 * 12/2008 Gossner ............... 257/355
2002/0105487 A1  8/2002 Inoue
(Continued)

FOREIGN PATENT DOCUMENTS

JP  2000-056727  2/2000
JP  2000-298456  10/2000
(Continued)

OTHER PUBLICATIONS

Korean Office action, dated May 31, 2011, along with an english translation thereof.
(Continued)

*Primary Examiner* — Douglas W Owens
*Assistant Examiner* — Dedei K Hammond
(74) *Attorney, Agent, or Firm* — Greenblum & Bernstein, P.L.C.

(57) ABSTRACT

A light control apparatus and a lighting appliance using the same enable increased luminous efficiency in light control and elongated operative life of a light source. The lighting appliance includes a light source and a light control apparatus. The light control apparatus comprises an electric current output circuit that outputs a constant electric current for lighting to a light source configured of an organic electroluminescence device, and a light control circuit that performs light control of the light source by intermittently supplying the constant electric current outputted from the electric current output circuit. The light control apparatus also comprises an electric discharge prevention circuit (diode) that prevents electric discharge of an electric charge charged in a capacitive component of the organic electroluminescence device.

14 Claims, 12 Drawing Sheets

3 RECTIFICATION CIRCUIT
4 PFC CONTROL UNIT
5 CURRENT OUTPUT UNIT
6 LIGHT CONTROL UNIT
70 DIODE (DISCHARGE PREVENTION MEANS)

U.S. PATENT DOCUMENTS

| | | |
|---|---|---|
| 2007/0170873 A1 | 7/2007 | Mishima |
| 2008/0030143 A1 | 2/2008 | Goriki et al. |
| 2008/0150436 A1* | 6/2008 | Suzuki ................ 315/169.3 |
| 2008/0185971 A1 | 8/2008 | Kinoshita |
| 2010/0013393 A1 | 1/2010 | Onishi et al. |
| 2010/0033692 A1 | 2/2010 | Watanabe et al. |
| 2010/0039581 A1 | 2/2010 | Mishima et al. |

FOREIGN PATENT DOCUMENTS

| | | |
|---|---|---|
| JP | 2001-272938 | 10/2001 |
| JP | 2002-010473 | 1/2002 |
| JP | 2004-245904 | 9/2004 |
| JP | 2004-361737 | 12/2004 |
| JP | 2005-011547 | 1/2005 |
| JP | 2005-347133 | 12/2005 |
| JP | 2006-065063 | 3/2006 |
| JP | 2006-210848 | 8/2006 |
| WO | 2005/106835 | 11/2005 |

OTHER PUBLICATIONS

U.S. Appl. No. 12/679,717 to Takaki et al., filed Mar. 24, 2010.

* cited by examiner

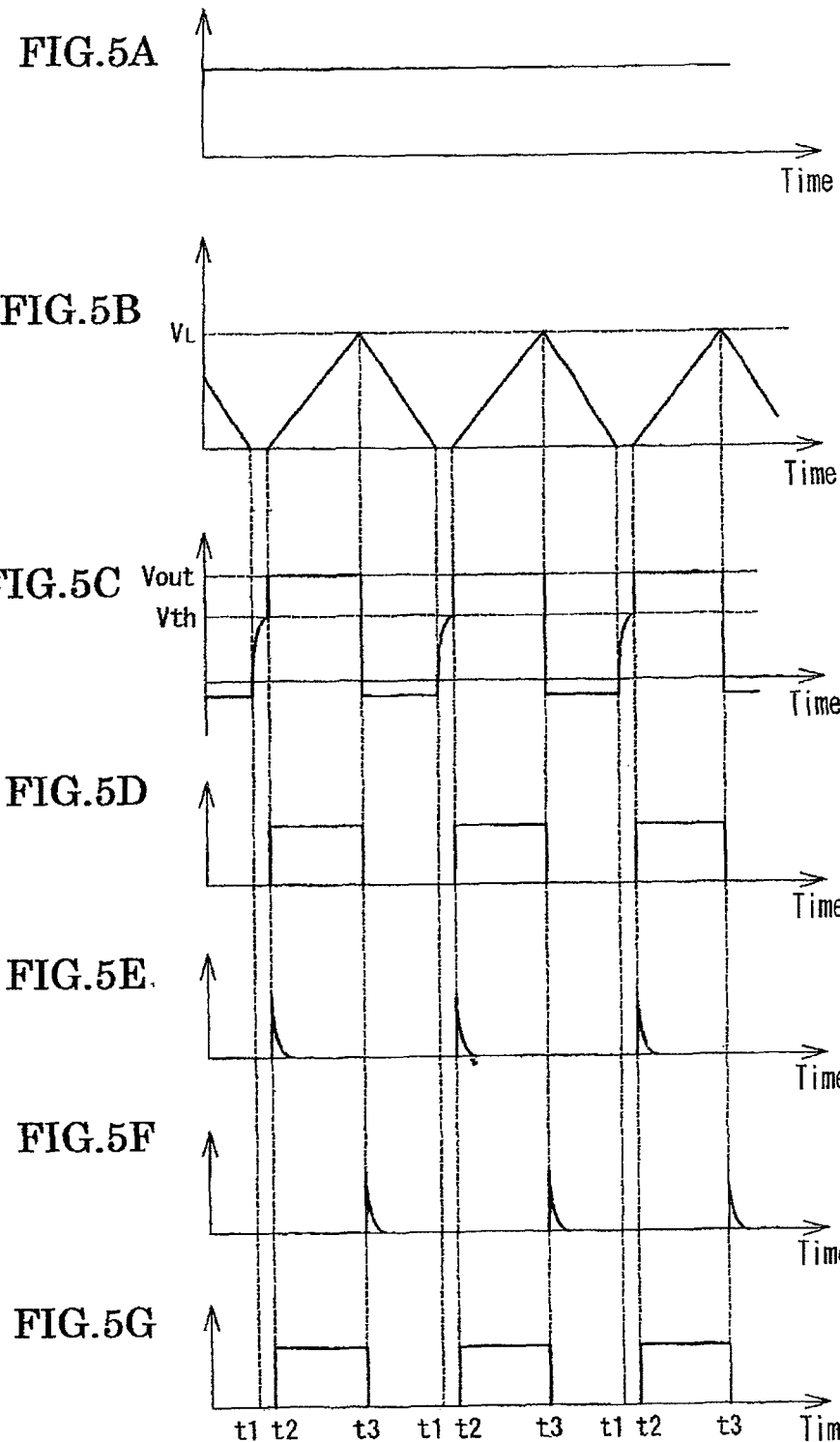

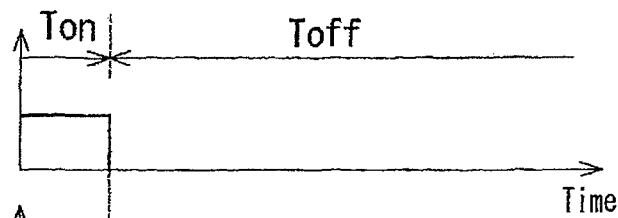
FIG.6A
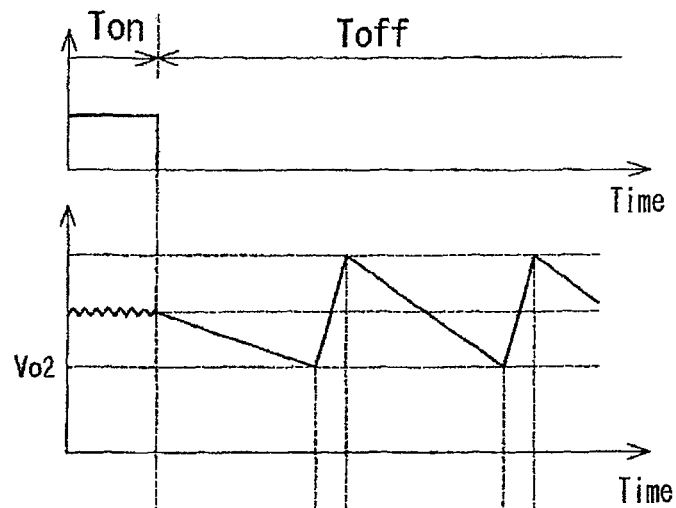
FIG.6B
FIG.6C
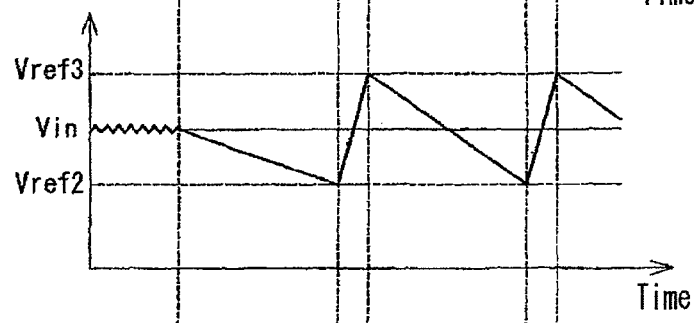
FIG.6D
FIG.6E
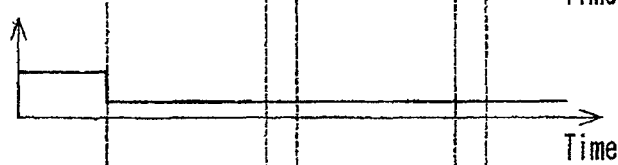
FIG.6F
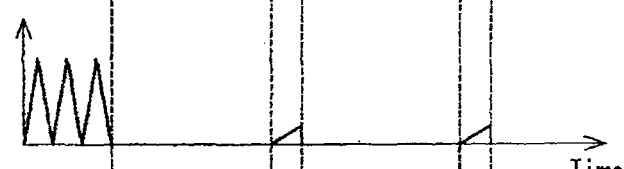
FIG.6G
FIG.6H
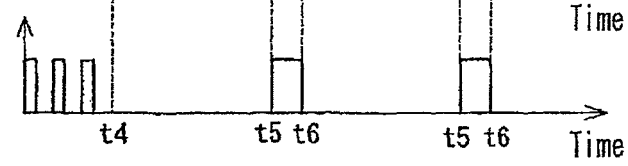

LIGHT CONTROL APPARATUS FOR LIGHTING AN ORGANIC ELECTROLUMINESCENCE DEVICE AND LIGHTING APPLIANCE USING THE SAME

TECHNICAL FIELD

The present invention relates to a light control apparatus for lighting an organic electroluminescence device and a lighting appliance using the same.

BACKGROUND ART

In recent years, an organic electroluminescence (Organic Electro-Luminescence, it is called "organic EL") device attracts attention as a light emitting device. The organic electroluminescence device (hereinafter, it is abbreviated as "organic EL device") has a characteristic of superior response because a time from start up of power distribution to light emission is very short and brightness instantly varies by varying electric current. In addition, the organic EL device has characteristics that the response hardly varies with temperature, and an angle of field of view thereof is near to 180 degrees. Due to these characteristics, the organic EL device is suitable to surface emission, and thus, it is utilized to a lighting appliance such as a backlight of a liquid crystal display apparatus, recently.

As for a light control apparatus for the organic EL device, one having light control function to control the brightness (brilliance) of the organic EL device is proposed as described in JP2006-210848A or JP2004-245904A, for example. FIG. 11 shows a circuit diagram of a lighting appliance which comprises a light source 1 consisting of an organic EL device and a light control apparatus 2 for lighting the light source 1. The light control apparatus 2 supplies a constant electric current of a predetermined value to the light source 1 consisting of the organic EL device, and comprises a rectification circuit 3 consisting of a diode bridge to perform full wave rectification to an alternating electric current which is an output of an AC power supply such as a commercial power source, a power-factor correction circuit unit (hereinafter, it is abbreviated as "PFC circuit") 4 which converts the alternating electric current output performed the full-wave rectification by the rectification circuit 3 to a direct electric current output, an electric current output circuit 5 which outputs a constant electric current for lighting the light source 1 on the basis of the direct electric current output from the PFC circuit 4, and a light control circuit 6 which performs light control of the light source 1 by intermittently supplying the constant electric current outputted from the electric current output circuit 5 to the light source 1.

The PFC circuit 4 has a coil (a choke coil) L1, an end of which is connected to an output terminal of a high electric potential side of the rectification circuit 3. A series circuit of a switching element Q1 such as a MOSFET of n-channel type and a resistor R1 is set between another end of the coil L1 and an output terminal of a low electric potential side of the rectification circuit 3. An anode of a diode D1 for preventing counter electric current is connected to a connection point of the coil L1 and the switching element Q1. A smoothing capacitor C1 such as an electrolytic capacitor is set between a cathode of the diode D1 and the output terminal of the low electric potential side of the rectification circuit 3.

In such PFC circuit 4, when switching on the switching element Q1, an electric current flows from the output terminal of the high electric potential side of the rectification circuit 3 through the coil L1 and the switching element Q1, so that an energy is accumulated in the coil L1. Subsequently, when switching off the witching element Q1, the energy accumulated in the coil L1 is supplied to the smoothing capacitor C1 through the diode D1. By repeating switching on and off of the switching element Q1, supplying and cutting off of the electric current to the capacitor C1 is repeated. By perform the on/off control of the switching element Q1 with a high frequency, a voltage between both terminals of the capacitor C1 can be set to a desired value.

The switching element Q1 is ON/OFF controlled by a PFC control unit 4a. The PFC control unit 4a detects presence or absence of an electric current flowing in the coil L1 by a coil L2 and detects a source voltage of the switching element Q1, and performs the ON/OFF control of the switching element Q1 based on the detected value of the electric current so as to maintain the voltage between the both terminals of the capacitor C1 constant. In addition, the PFC control unit 4a comprises a power-factor correction function to correct distortion of harmonic component of the electric current obtained from the AC power supply, and sets an ON term of the switching element Q1 to correct the power-factor of input of the AC power supply, for example.

The electric current output circuit 5 is a step-down chopper circuit which depresses a voltage of the direct electric current output of the PFC circuit 4, and serves as a constant electric current source which outputs a constant electric current to the light source 1. The electric current output circuit 5 comprises: a switching element Q2 such as a MOSFET of n-channel type, a drain of which is connected to the high electric potential side of the smoothing capacitor C1 of the PFC circuit 4; a coil L3, an end of which is connected to a source of the switching element Q2; a diode D2 for backflow, an anode of which is connected to the low electric potential side of the smoothing capacitor C1; a smoothing capacitor C2 such as an electrolytic capacitor connected to another end of the coil L3; a resistor R2 set between the low electric potential side of the capacitor C2 and an anode of the diode D2; and an electric current control unit 5a which performs ON/OFF control of the switching element Q2. By performing the ON/OFF control of the switching element Q2, a voltage between both ends of the capacitor C2, that is, the voltage applied to both ends of the light source 1 can be set to a desired value. The electric current control unit 5a performs the ON/FF control of the switching element Q2 based on a voltage between both ends of the resistor R2 so as to make the voltage between the both ends of the smoothing capacitor C2 constant, and thus, the electric current output circuit 5 outputs a constant electric current to the light source 1.

The light control circuit 6 is configured of a switching element Q3 such as a MOSFET of n-channel type, a drain of which is connected to a high electric potential side of the capacitor C2 of the electric current output circuit 5 and a light control unit 6a which performs the ON/OFF control of the switching element Q3. The light control unit 6a performs the ON/OFF control of the switching element Q3 in a high frequency by applying voltages to a gate of the switching element Q3 as shown in FIG. 12A based on a given duty ratio. Consequently, electric currents are intermittently outputted to the light source 1 as shown in FIG. 12B, so that light control of the light source 1 is performed.

By the way, an equivalent circuit of the organic EL device which is the light source 1 is represented by a parallel circuit of a diode and a capacitor. In other words, the organic EL device is a capacitive load having a capacitive component. Therefore, when supplying of electric power to the light source 1 is started by switching on the switching element Q3 in the light control apparatus 2 of the conventional case, a surge electric current (a charge electric current) flows in the organic EL device to charge the capacitive component of the organic EL device, so that stress is given to the organic EL device (hatched regions designated by symbols P1 in FIG. 12B). In addition, since the organic EL device does not emit light until the capacitive component is charged, rising-up of light flux outputted from the light source 1 is delayed. On the other hand, when the switching element Q3 is switched off and supplying of electric power to the light source 1 is stopped, electric charge accumulated in the capacitive component of the organic EL device is discharged (hatched regions designated by symbols P2 in FIG. 12B). Therefore, a surge electric current flows to charge the capacitive component of the organic EL device again, when the switching element Q3 is switched on subsequently.

In this way, since charge and discharge of the capacitive component of the organic EL device serving as the light source 1 are performed when the switching element Q3 is switched on and off, electric power supplied to the light source 1 is consumed wastefully, and luminous efficiency becomes worse. Such problems are significant when the switching element Q3 is switched on and off in a high frequency.

DISCLOSURE OF INVENTION

The present invention is conceived to solve the above mentioned problems in the prior art, and a purpose of the invention is to provide a light control apparatus and a lighting appliance using the same, which enable to improve luminous efficiency in light control and to elongate an operating life of a light source.

A light control apparatus in accordance with an aspect of the present invention comprises: an electric current output circuit which outputs a constant electric current for lighting a light source configured of an organic electroluminescence device; a light control circuit which performs light control of the light source by intermittently supplying the constant electric current outputted from the electric current output circuit; and an electric discharge prevention circuit which prevents electric discharge of an electric charge charged in a capacitive component of the organic electroluminescence device.

In addition, a lighting appliance in accordance with an aspect of the present invention comprises the above light control apparatus and a light source configured of an organic electroluminescence device.

According to such configurations, when the capacitive component of the organic EL device is once charged in the light control, discharge of electric charge is prevented by the electric discharge prevention circuit, so that loss of electric power supplied to the light source is small, and thus, luminous efficiency can be increased, even though a switching element of the light control circuit is ON/OFF controlled repeatedly. In addition, since the organic EL device immediately emits lights responding to switching ON of the switching element, rising-up of light flux of the light source becomes precipitous, and brightness of light emission of the lighting appliance using this light control apparatus can be increased. Moreover, surge electric currents due to charge and discharge of the capacitive component do not flow repeatedly in the organic EL device, so that stress loaded on the organic EL device is reduced and an operation life of the light source can be elongated.

BRIEF DESCRIPTION OF DRAWINGS

FIG. 5A is a timing chart showing ON/OFF control of the above switching element Q3. FIG. 5B is a timing chart showing variation of voltage between both ends of a resistor R2 in the circuit of FIG. 3. FIG. 5C is a timing chart showing variation of source voltage of the switching element Q2 in the circuit of FIG. 3. FIG. 5D is a timing chart showing variation of signal level of a first comparator 50a in the circuit of FIG. 3. FIG. 5E is a timing chart showing signals inputted into a set terminal of a flip-flop circuit 50g in the circuit of FIG. 3. FIG. 5F is a timing chart showing signals inputted into a reset terminal of the above flip-flop circuit 50g. FIG. 5G is a timing chart showing ON/OFF control of the above switching element Q2.

FIG. 6A is a timing chart showing ON/OFF control of the above switching element Q3. FIG. 6B is a timing chart showing variation of voltage between both ends of a capacitor C2 in the circuit of FIG. 3. FIG. 6C is a timing chart showing variation of voltage Vin which is obtained by dividing a voltage between the both ends of the capacitor C2 by resisters R6, R7 and R8. FIG. 6D is a timing chart showing signals inputted into the set terminal of the above flip-flop circuit 50g. FIG. 6E is a timing chart showing variation of voltage of an inverting input terminal of a fourth comparator 50d in the circuit of FIG. 3. FIG. 6F is a timing chart showing variation of electric current flowing in the above resistor R2. FIG. 6G is a timing chart showing signals inputted into the reset terminal of the above flip-flop circuit 50g. FIG. 6H is a timing chart showing ON/OFF control of the above switching element Q2.

BEST MODE FOR CARRYING OUT THE INVENTION

First Embodiment

Figure 1:
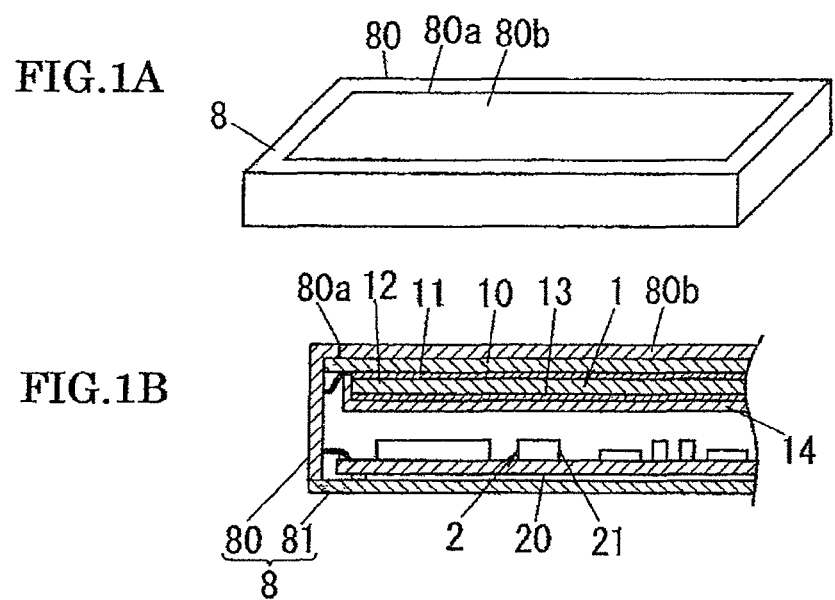
FIG. 1A is a perspective illustration showing an appearance of a lighting appliance in accordance with a first embodiment of the present invention.
FIG. 1B is a cross sectional illustration showing an inside constitution of the above lighting appliance.

A light control apparatus and a lighting appliance using the same in accordance with a first embodiment of the present invention are described with reference to figures. FIG. 1A is a perspective illustration showing an appearance of the lighting appliance, and FIG. 1B is a cross sectional illustration showing an inside constitution thereof. As shown in the figures, the lighting appliance comprises a light source 1 configured of an organic EL device, a light control apparatus 2 to control lighting of the light source 1 and a casing 8 for containing the light source 1 and the light control apparatus 2.

The light source 1 comprises a supporting board 10, a transparent electrode 11 formed on a first face (lower face in the figure) side of the supporting board 10, a light emission layer 12 formed on a surface (lower face) among the surfaces of the transparent electrode 11 opposite to the supporting board 10; a reflection electrode 13 formed of a metal on a surface (lower face) among the surfaces of the light emission layer 12 opposite to the transparent electrode 11, and a sealing member 14 provided to cover the transparent electrode 11, the light emission layer 12 and the reflection electrode 13 from the first face (lower face) of the supporting board 10.

The supporting board 10 is a flat-shaped member for supporting the light emission layer 12 and formed of a material having transparency to lights emitted from the light emission layer 12. As for the supporting board 10, a transparent board such as a glass board is used. The transparent electrode 11 is an electroconductive thin film formed of a material having transparency to the lights emitted from the light emission layer 12. As for the material of such transparent electrode 11, a transparent conductive material such as ITO (Indium Tin Oxide) is used. The light emission layer 12 is formed of an organic material of fluorescent material or an organic material including fluorescent material, for example, and comprises a positive hole injection layer, a positive hole transportation layer, an electron transportation layer and an electron injection layer are provided, if necessary. The reflection electrode 13 is an electroconductive thin film formed of a material which reflects the lights emitted from the light emission layer 12. As for the material of such reflection electrode 13, aluminum, aluminum-lithium alloy, or magnesium-silver alloy is used, for example.

By the way, terminal portions (not illustrated) for supplying electric power are provided on the transparent electrode 11 and the reflection electrode 13. The sealing member 14 is air-tightly attached to the first face (lower face) side of the supporting board 10 with an adhesive or the like so that the terminal portions of the transparent electrode 11 and the reflection electrode 13 are exposed. The sealing member 14 is formed to be a box-shape a face of which is opened with an insulative material such as a glass, and used to prevent deterioration of the light emission layer 12 formed of the organic material due to influence of oxygen or humidity, gradually.

In this way, the light source 1 is an organic EL device of a rectangular plate shape which is constituted by building up of the transparent electrode 11, the light emission layer 12 and the reflection electrode 13 sequentially, and when a predetermined voltage is applied between the transparent electrode 11 and the reflection electrode 13 through the terminal portions for supplying electric power (generating electric potential difference), lights are emitted from the light emission layer 12.

The lights emitted from the light emission layer 12 toward the transparent electrode 11 side pass through the transparent electrode 11, subsequently enter into the supporting board 10, pass through an inside of the supporting board 10 and exit from a second face (upper face) side of the supporting board 10 to outside of the supporting board 10. On the other hand, the lights emitted from the light emission layer 12 toward the reflection electrode 13 side are reflected by the reflection electrode 13 toward the transparent electrode 11 side, subsequently pass through the inside of the supporting board 10 and exit from the upper face side of the supporting board 10 to outside of the supporting board 10.

Considering manufacturing process of building up the transparent electrode 11, the light emission layer 12 and the reflection electrode 13 sequentially and adhering the sealing member 14 on the supporting board 10, the light source 1 is an organic EL device of single-sided emission type in which the second face (bottom face in the manufacturing process) of the supporting board 10 is light emitting face and the face (upper face in the manufacturing process) among the surfaces of the sealing member 14 opposite to the supporting board 10 is non-light emission face, and especially bottom emission type one which emits lights toward the bottom face of the supporting board 10.

The casing 8 is constituted by a body 80 of box-shape, a lower face of which is opened, and a cover 81 which is to be attached to the body 80 to cover the opening of the lower face, as shown in FIG. 1B. The body 80 and the cover 81 are formed of aluminum, for example. A window aperture 80a, from which the lights emitted from the light source 1 exit to outside of the casing 8, is formed on a ceiling of the body 80. In addition, the window aperture 80a is closed by a transparent cover 80b which is formed of a material (for example, a glass) having transparency to the lights emitted from the light source 1. The light source 1 is adhered from the inside of the box-shaped body 80 so that the light emitting face (the second face of the supporting board 10) faces the transparent cover 80b fitted to the window aperture 80a. Thus, an outer face of the transparent cover 80b serves as a light emitting face of the casing 8. A printed circuit board 20 of the light control apparatus 2 is attached to an inner face of the cover 81, and the cover 81 is attached to the body 80 in a manner so that the light control apparatus 2 is disposed between the light source 1 and the cover 81 in an inner space of the body 80. In addition, the light control apparatus 2 and the light source 1 are electrically connected by wire bonding or the like.

Figure 2:
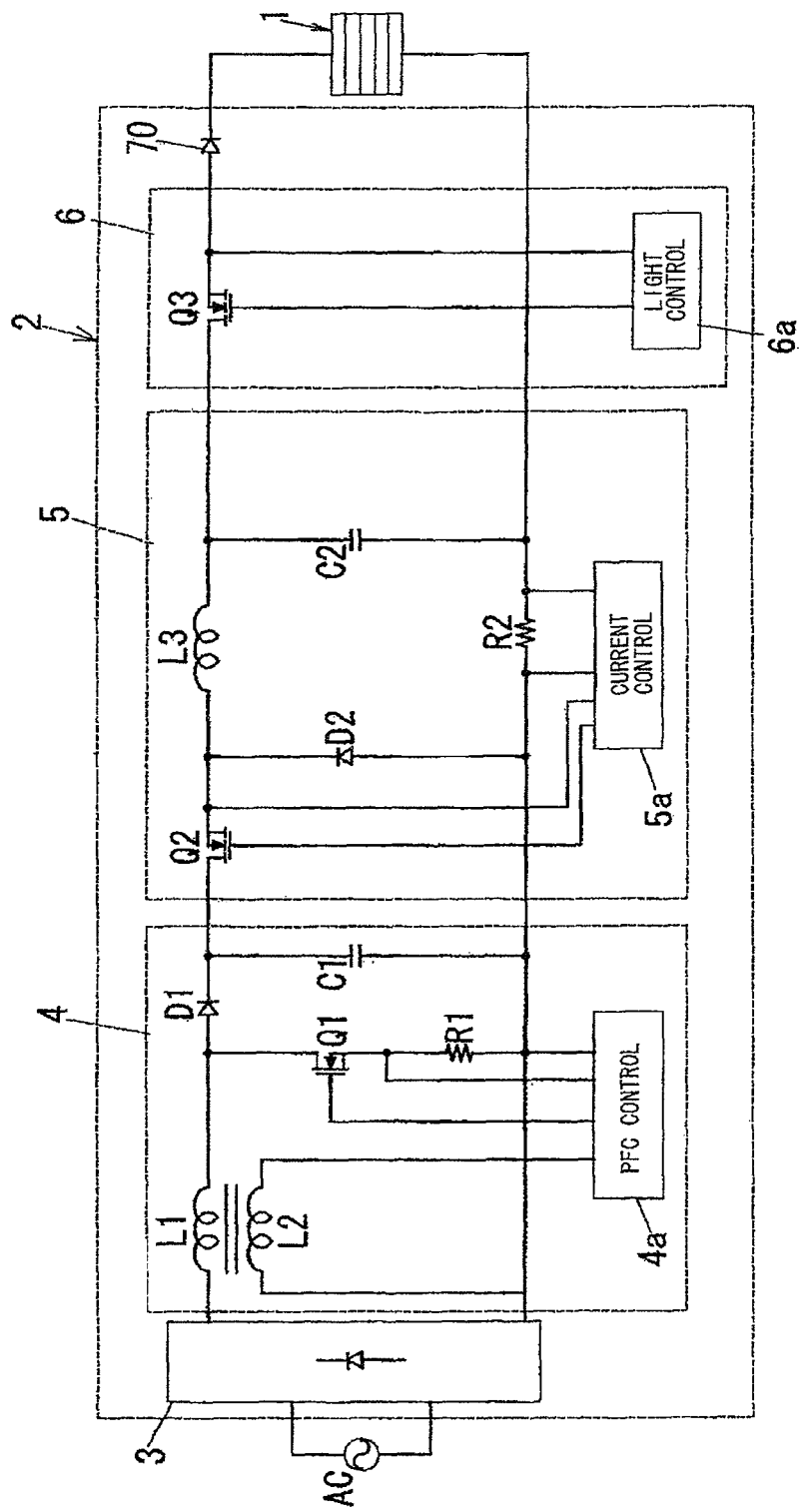
FIG. 2 is a circuit diagram showing a constitution of a light control apparatus 2 in the first embodiment.

The light control apparatus 2 in the first embodiment is constituted that electronic elements 21 constituting a lighting circuit for controlling lighting of the light source 1 are mounted on the printed circuit board 20, and has a circuit constitution shown in FIG. 2, for example. The circuit constitution of the light control apparatus 2 is described below with reference to FIG. 2 to FIG. 7.

The light control apparatus 2 in the first embodiment is similar to the above conventional one in terms of having a rectification circuit 3, a PFC circuit 4, an electric current output circuit 5 and a light control circuit 6, however, different in terms of setting an electric discharge prevention circuit constituted by a diode 70 between an output terminal of the light control circuit 6 and the light source 1. In addition, a constitution of an electric current control unit 5a of the electric current output circuit 5 is different from that of the conventional one. Moreover, since constitutions of the rectification circuit 3 and the PFC circuit 4 are the same as those of the conventional ones, description of them is omitted. Moreover, since a constitution other than the electric current control unit 5a of the electric current output circuit 5 is the same as that of the conventional one, description of it is omitted.

Figure 3:
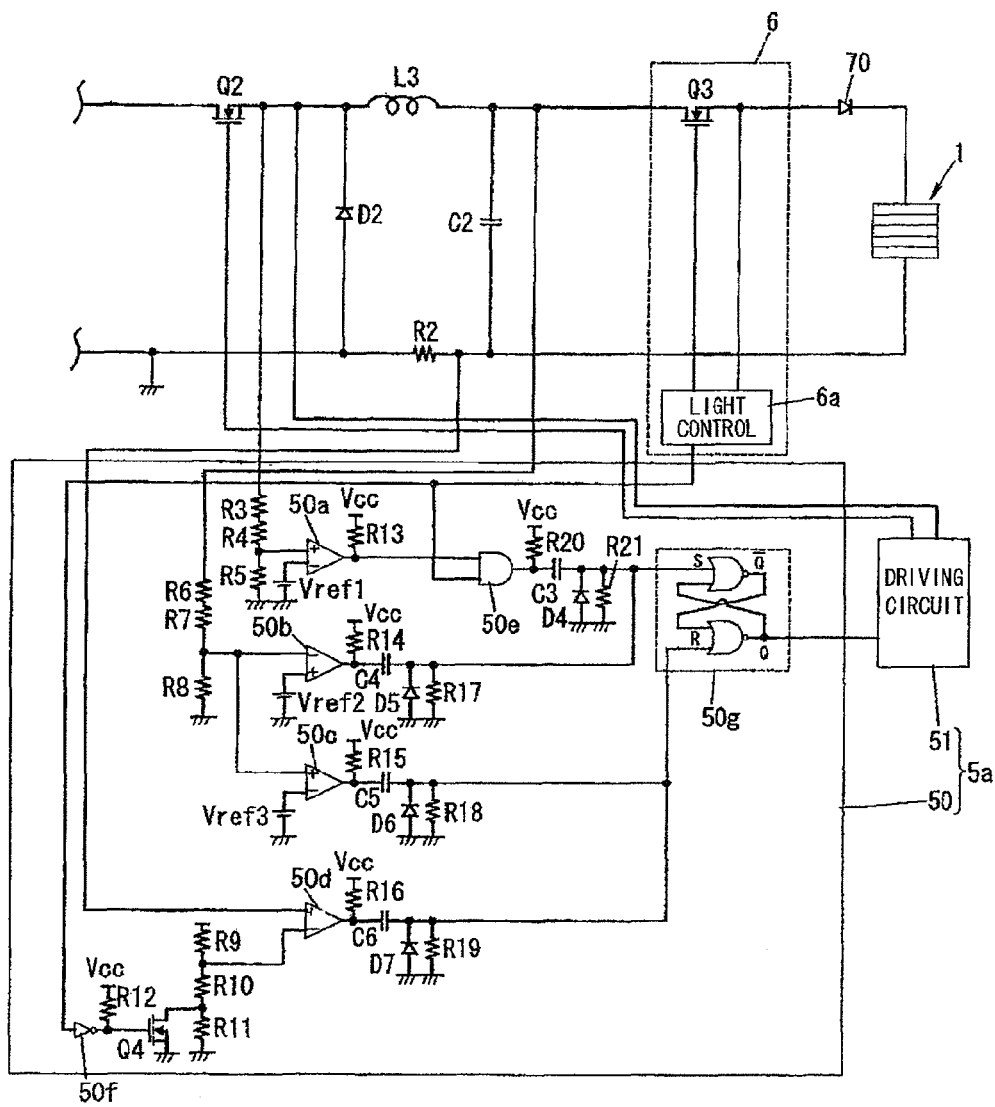
FIG. 3 is a circuit diagram showing a concrete constitution of an electric current control unit 5a of the above light control apparatus.
Figure 4A:
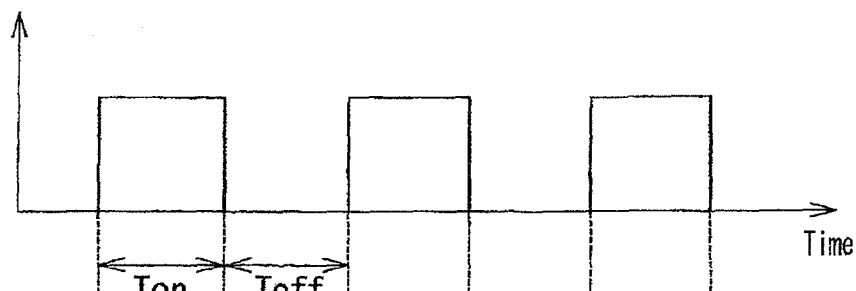
FIG. 4A is a timing chart showing waveforms of signals (voltage) inputted into a gate of a switching element Q3 in the circuit of FIG. 3.
Figure 4B:
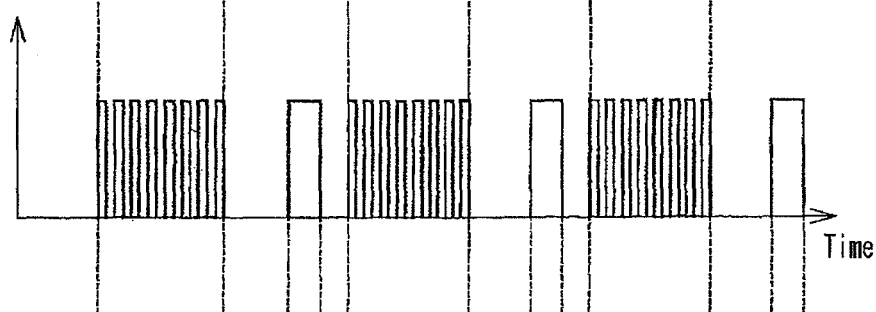
FIG. 4B is a timing chart showing waveforms of signals (voltage) inputted into a gate of a switching element Q2 in the circuit of FIG. 3.
Figure 4C:
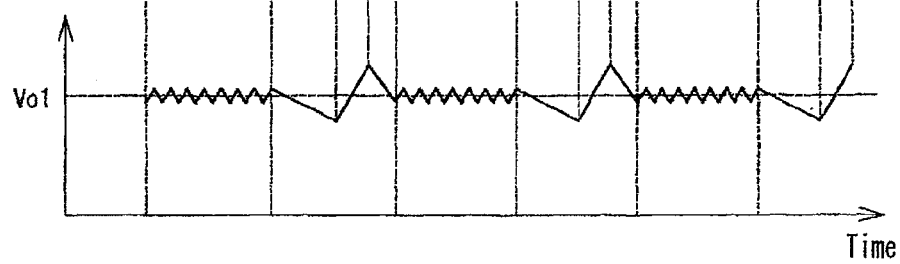
FIG. 4C is a timing chart showing output voltage of the electric current output circuit 5 of the above light control apparatus.

As shown in FIG. 3, the electric current control unit 5a in the first embodiment is constituted by a step-down chopper control circuit 50 and a driving circuit (driving IC) 51 for switching ON/OFF a switching element Q2 responding to control signals outputted from the step-down chopper control circuit 50. As shown in FIGS. 4A to 4C, the electric current control unit 5a performs ON/OFF control of the switching element Q2 in a manner so that a voltage between both ends of a smoothing capacitor C2 (output voltage of the electric current output circuit 5) becomes a value in a predetermined range including a predetermined voltage Vo1, however, the contents of the control is different in a term Ton while a switching element Q3 is switched on from that in a term Toff while the switching element Q3 is switched off. In addition, FIG. 4A shows waveforms of signals (voltage) inputted into a gate of the switching element Q3, FIG. 4B shows waveforms of signals (voltage) inputted into a gate of the switching element Q2, and FIG. 4C shows output voltage of the electric current output circuit 5.

As shown in FIG. 3, the step-down chopper control circuit 50 mainly has four comparators 50a to 50d, a logic multiplication circuit (AND gate) 50e, an inversion circuit (inverter, NOT gate) 50f and an SR-type flip-flop circuit 50g constituted by a pair of NOR gates.

A noninversion input terminal of a first comparator 50a is connected to a point between a resistor R4 and a resistor R5 in a series circuit (a divider circuit) constituted by a resistor R3, the resistor R4 and the resistor R5 which divides a voltage applied between a source of the switching element Q2 and a ground (hereinafter, it is called "source voltage"). In addition, a predetermined reference voltage Vref1 is inputted into the noninversion input terminal of the first comparator 50a. The first comparator 50a is constituted so as to output a high level signal when the source voltage of the switching element Q2 overreaches a threshold voltage Vth (however, the threshold value Vth is a value smaller than a voltage Vout between both ends of a smoothing capacitor C1 which is an output voltage of the PFC circuit 4). Therefore, the reference voltage Vref1 is set to be a value corresponding to the threshold voltage Vth. In addition, an output terminal of the first comparator 50a is connected to an internal electrical power source Vcc of 5V, for example, through a resistor R13 and further connected to an input terminal of a logic multiplication circuit 50e.

An inversion input terminal of a second comparator 50b is connected to a point between a resistor R7 and a resistor R8 in a series circuit (a divider circuit) constituted by a resistor R6, the resistor R7 and the resistor R8 which divides a voltage between both ends of a smoothing capacitor C2. In addition, a predetermined reference voltage Vref2 is inputted into a noninversion input terminal of the second comparator 50b. The second comparator 50b is constituted so as to output a high level signal when the voltage between the both ends of the smoothing capacitor C2 becomes less than a predetermined voltage Vo2 (however, Vo2<Vo1). Therefore, the reference voltage Vref2 is set to be a value corresponding to the voltage Vo2. In addition, an output terminal of the second comparator 50b is connected to the internal electrical power source Vcc through a resistor R14 and further connected to a set terminal (S-terminal) of a flip-flop circuit 50g through a capacitor C4. Moreover, a connection point of the capacitor C4 and the set terminal of the flip-flop circuit 50g is connected to the ground through a diode D5 and further connected to the ground through a resistor R17.

A noninversion input terminal of a third comparator 50c is connected to a point between a resistor R7 and a resistor R8. In addition, a predetermined reference voltage Vref3 is inputted into an inversion input terminal of the third comparator 50c. The third capacitor 50c is constituted so as to output a high level signal when the voltage between the both ends of the smoothing capacitor C2 becomes larger than a predetermined voltage Vo3 (however, Vo3>Vo1). Therefore, the reference voltage Vref3 is set to be a value corresponding to the voltage Vo3. In addition, an output terminal of the third comparator 50c is connected to the internal electrical power source Vcc through a resistor R15 and further connected to a reset terminal of the flip-flop circuit 50g through a capacitor C5. Moreover, a connection point of the capacitor. C5 and the reset terminal of the flip-flop circuit 50g is connected to the ground through a diode D6 and further connected to the ground through a resistor R18.

A noninversion input terminal of a fourth comparator 50d is connected to a point between a resistor R2 and the light source 1. In addition, an inversion input terminal of the fourth comparator 50d is connected to a point between a resistor R9 and a resistor R10 in a series circuit (a divider circuit) constituted by the resistor R9, the resistor R10 and a resistor R11 which divides the internal electrical power source Vcc. The fourth comparator 50d is for preventing an electric current flowing in the resistor R2 not to be equal to or larger than a predetermined value, and a voltage VL at the connection point between the resistor R9 and the resistor R10 is the upper limit of the voltage between both ends of the resistor R2. On the other hand, a connection point of the resistor R10 and the resistor R11 is connected to a drain of a switching element Q4 consisting of a MOSFET of n-channel type, and a source of the switching element Q4 is connected to the ground. A gate of the switching element Q4 is connected to the internal electrical power source Vcc through a resistor R12 and further connected to an output terminal of an inversion circuit 50f. An input terminal of the inversion circuit 50f is connected to a light control unit 6a, and a high level signal when the switching element Q3 is switched on and a low level signal when it is off are inputted into the input terminal. In addition, an output terminal of the fourth comparator 50d is connected to the internal electric power source Vcc through a resistor R16 and further connected to the reset terminal of the flip-flop circuit 50g through a capacitor C6. In addition, a connection point of the capacitor C6 and the reset terminal is connected to the ground through a diode D7 and further connected to the ground through a resistor R19.

The other input terminal of the logic multiplication circuit 50e is connected to the light control unit 6a, and a high level signal when the switching element Q3 is switched on and a low level signal when it is off are inputted into the input terminal. In addition, an output terminal of the logic multiplication circuit 50e is connected to the internal electrical power source Vcc through a resistor R20 and further connected to the set terminal of the flip-flop circuit 50g through a capacitor C3. In addition, a connection point of the capacitor C3 and the set terminal is connected to the ground through a diode D4 and further connected to the ground through a resistor R21.

An output terminal (Q-terminal) of the flip-flop circuit 50g is connected to the driving circuit 51. Therefore, signals outputted from the output terminal of the flip-flop circuit 50g become control signals of the driving circuit 51. Hereupon, when the control signal is in a high level, the drive circuit 51 applies a voltage equal to or larger than a predetermined value to the gate of the switching element Q2, so that a path between the drain and the source of the switching element Q2 is conducted (switching on the switching element Q2). On the other hand, when the control signal is in a low level, the path between the drain and the source of the switching element Q2 is cutoff by decreasing the voltage of the gate of the switching element Q2 less that the predetermined value (switching off the switching element Q2).

An operation of the electric current output circuit 5 is described below with reference to FIGS. 5A to 5G and FIGS. 6A to 6H. At first, when the switching element Q3 is switched on (that is, in the term Ton), the light control unit 6a outputs a high level signal to the logic multiplication circuit 50e and the inversion circuit 50f respectively, as shown in FIG. 5A. In this case, since the inversion circuit 50f outputs a low level signal, the switching element Q4 is switched off, and a voltage which is divided the internal electric power source Vcc by the resistors R9, R10 and R11 is inputted into the noninversion input terminal of the fourth comparator 50d.

By the way, when it is assumed that the switching element Q3 is switched on and the switching element Q2 is switched off, the voltage between both ends of the resistor R2 is decreased to be "0" as shown in FIG. 5B (at a time W. Then, the source voltage of the switching element Q2 starts to rise up and exceeds the threshold voltage Vth finally as shown in FIG. 5C (at a time t2). At that time, the first comparator 50a outputs a high level signal as shown in FIG. 5D, and the high level signal is inputted into both input terminals of the logic multiplication circuit 50e respectively. Therefore, the logic multiplication circuit 50e outputs a high level signal. Then, since the high level signal is inputted into the set terminal of the flip-flop circuit 50g as shown in FIG. 5E, the flip-flop circuit 50g outputs a high level signal to the driving circuit 51 as shown in FIG. 5G. Consequently, the driving circuit 51 switches on the switching element Q2.

When the switching element Q2 is switched on, the voltage between both ends of the resistor R2 increases and reaches to the voltage VL finally as shown in FIG. 5 (at a time t3), and the fourth comparator 50d outputs a high level signal. Then, the high level signal will be inputted into the reset terminal of the flip-flop circuit 50g as shown in FIG. 5F, and the flip-flop circuit 50g outputs a low level signal to the driving circuit 51. Consequently, the drive circuit 51 switches off the switching element Q2 as shown in FIG. 5G. By repeating such operations, the electric current control unit 5a maintains the output voltage of the electric current output circuit 5 in the voltage Vo1.

On the other hand, in case that the switching element Q3 is switched off from switched on at a time t4 (that is, in a term Toff) as shown in FIG. 6A, the light control unit 6a outputs a low level signal to the logic multiplication circuit 50e and the inversion circuit 50f. In that case, the logic multiplication circuit 50e outputs a low level signal regardless of the output of the first comparator 50a. In addition, since the inversion circuit 50 starts to output a high level signal, the switching element Q4 will be switched on, and a voltage which is divided the internal electronic power source Vcc by the resistors R9 and R10 is inputted into the noninversion input terminal of the fourth comparator 50d. In other words, the voltage VL inputted into the noninversion input terminal of the fourth comparator 50d decreases as show in FIG. 6E. Therefore, when the switching element Q3 is switched off, the upper limit of the electric current flowing in the resistor R2 is set to be lower than that in the time when the switching element Q3 is switched on, as shown in FIG. 6F.

When the switching element Q2 is switched off in the term Toff, the voltage between both ends of the capacitor C2 decreases and becomes less than the voltage Vo2 which is the lower limit in time, as shown in FIG. 6B. The voltage Vin which is obtained by dividing the voltage between both ends of the capacitor C2 by the resistors R6, R7 and R8 decreases and becomes less than the reference voltage Vref2 in time (at a time t5), as shown in FIG. 6C. At that time, since the second comparator 50b outputs a high level signal, the high level signal is inputted into the set terminal of the flip-flop circuit 50g as shown in FIG. 6D, and consequently, the flip-flop circuit 50g outputs a high level signal to the driving circuit 51, and the driving circuit 51 switches on the switching element Q2.

When the switching element Q2 is switched on, the voltage between the both ends of the capacitor C2 increases and reaches to the voltage Vo3 which is the upper limit finally, as shown in FIG. 6B. Then, the voltage Vin increases and reaches to the reference voltage Vref3 finally (at a time t6) as shown in FIG. 6C. At that time, since the third comparator 50c outputs a high level signal, the high level signal is inputted into the reset terminal of the flip-flop circuit 50g as shown in FIG. 6G, and consequently, the flip-flop circuit 50g outputs a low level signal to the driving circuit 51, and the driving circuit 51 switches off the switching element Q2. By repeating such operations, the electric current control unit 5a maintains the output voltage of the electric current output circuit 5a in s predetermined range including the voltage Vo1 (in a range from the voltage Vo2 to the voltage Vo3).

In this way, the voltage between both ends of the capacitor C2 does not varied largely from Vo1 even when the switching element Q3 is switched off, so that an optimum voltage is applied to the light source 1 when the switching element Q3 is switched on.

The electric discharge prevention circuit which is constituted by a single diode 70 is set between an output terminal of the light control circuit 6 (a source of the switching element Q3) and the light source 1 in a manner so that an anode of the diode 70 is connected to the output terminal of the light control circuit 6 (the source of the switching element Q3), and a cathode thereof is connected to the light source 1, respectively. Therefore, electric current flows from the output terminal of the light control circuit 6 to the light source 1, however, no electric current flows from the light source 1 to the output terminal of the light control circuit 6.

Figures 7A, 7B:
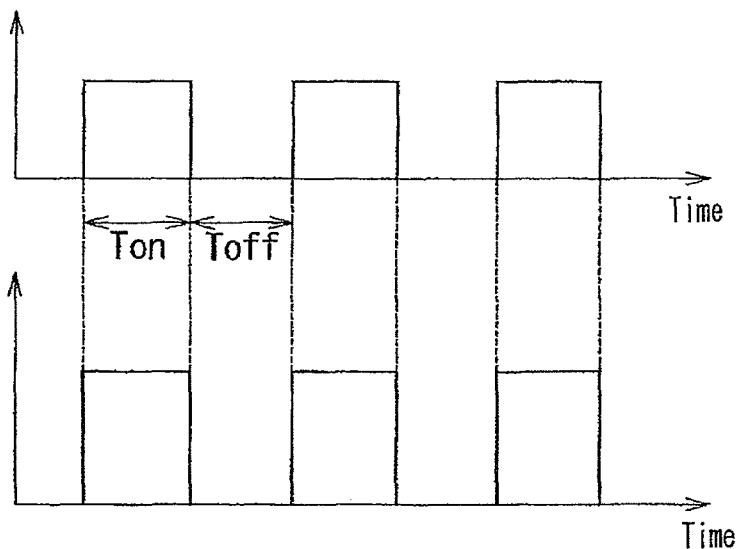
FIG. 7A is a timing chart showing variation of voltage applied to a gate of the switching element Q3 by a light control unit 6a in FIG. 2 or FIG. 3.
FIG. 7B is a timing chart showing constant electric current which intermittently flows in a light source 1 by ON/OFF control (PWM control) of the switching element Q3.
Figure 8:
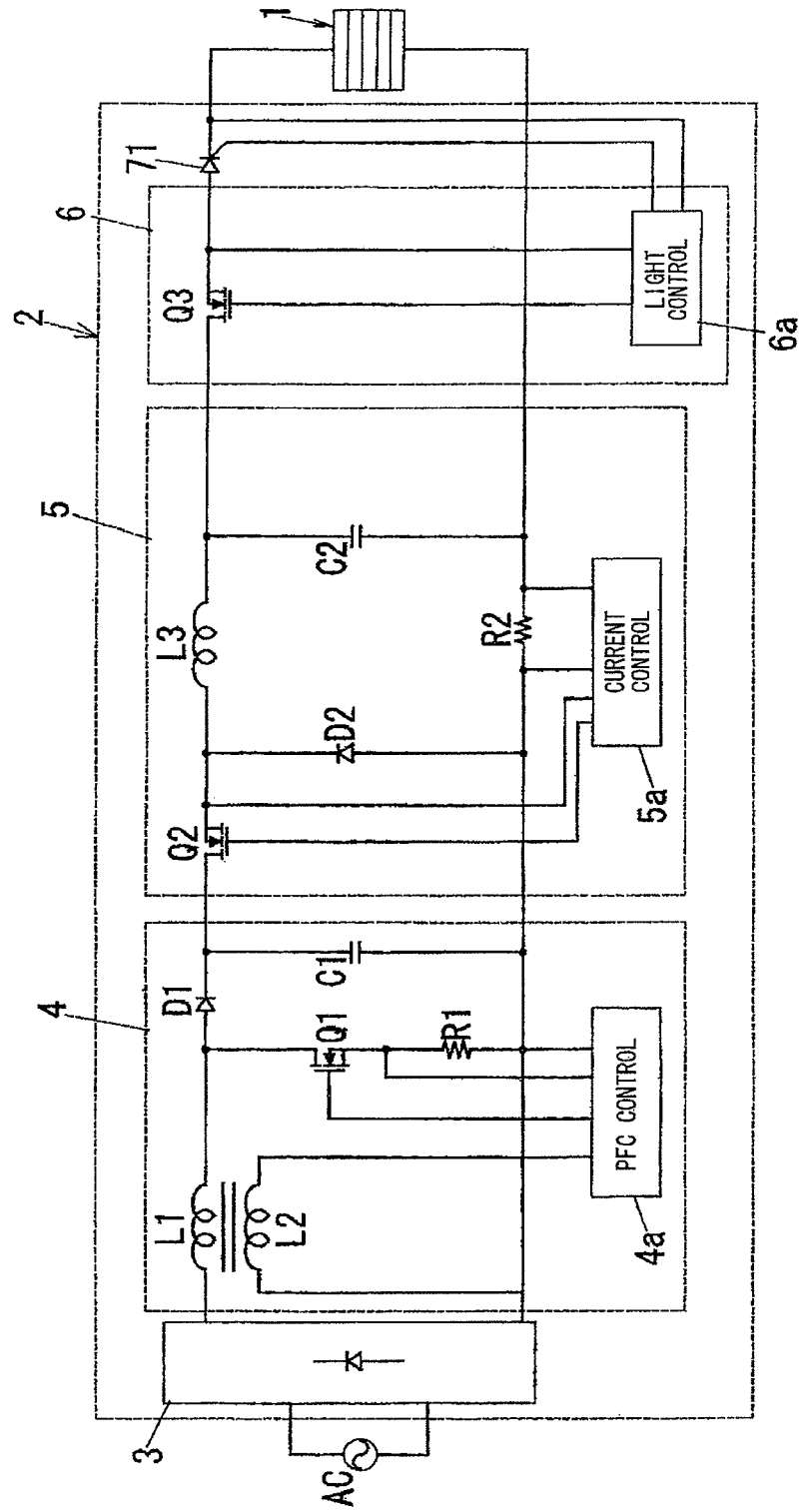
FIG. 8 is a circuit diagram showing a constitution of a light control apparatus 2 in a second embodiment of the present invention.

Subsequently, an operation of the light control apparatus 2 in the first embodiment id described. When the light control apparatus 2 starts the operation thereof, the light control unit 6a applies a voltage to the gate of the switching element Q3 with a duty ratio applied from an external apparatus so as to perform the ON/Off control (PWM control) of the switching element Q3 as shown in FIG. 7A, and a constant electric current is intermittently flown in the light source 1 as shown in FIG. 7B. Thereby, the light source 1 is lit with a brightness corresponding to the above duty ratio. During such light control, when the switching element Q3 is switched off, no electric current flows from the output terminal of the light control circuit 6 to the light source 1, so that the light source 1 tries to discharge electric charge which is charged in the capacitive component of the organic EL device, however, since the above mentioned diode 70 is set between the output terminal of the light control circuit 6 and the light source 1, the electric discharge from the light source 1 is prevented.

Figure 12A:
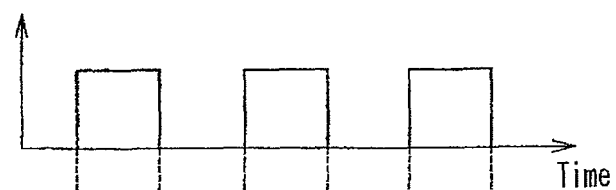
FIG. 12A is a timing chart showing variation of voltage applied to a gate of a switching element Q3 by a light control unit 6a in the above conventional light control device.
Figure 12B:
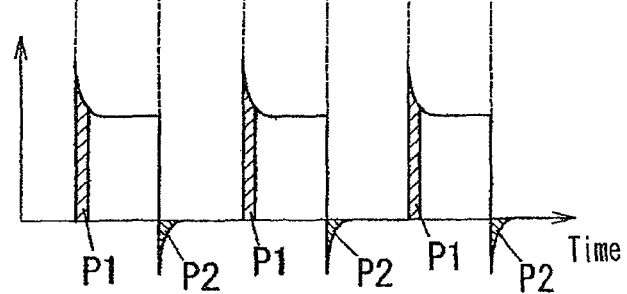
FIG. 12B is a timing chart showing constant electric current intermittently flowing in a light source 1 by ON/OFF control of the switching element Q3 in the above conventional light control apparatus.

In this way, it is found from the comparison with FIG. 7A and FIG. 7B with FIG. 12A and FIG. 12B relating to the conventional one, according to the light control apparatus 2 in the first embodiment, when the capacitive component of the organic EL device is once charged in the light control, the electric discharge is prevented by the diode 70 serving as the electric discharge prevention circuit, and thus, even when the switching element Q3 of the light control apparatus 2 is repeatedly switched ON/OFF, loss of the electric power supplied to the light source 1 can be reduced and luminous efficiency can be increased. In addition, the organic EL device immediately emits lights responding to switching on of the switching element Q3, so that rising-up of light flux of the light source can be made precipitous, and thus, brightness of light emission of a lighting appliance using this light control apparatus can be increased. In addition, surge electric currents due to charge and discharge of the capacitive component do not repeatedly flow in the organic EL device, so that stress loaded on the organic EL device can be reduced and the operative life of the light source can be elongated.

In addition, the diode 70 is exemplified as the electric discharge prevention circuit set between the output terminal of the light control circuit 6 and the light source 1, however, the electric discharge prevention circuit is not limited to the diode, and it may be a rectifying circuit which passes electric current from the output terminal of the light control circuit 6 to the light source but shuts off the electric current from the light source 1 to the output terminal of the light control circuit 6, for example. As for examples of such rectification circuit, a thyristor in which a path between an anode and a cathode is not conducted normally, and when a predetermined voltage is applied to a age, an electric current can flows from the anode to the cathode, like the diode, but no electric current can flow from the cathode to the anode, or a gate turn off thyristor (GTO) in which an electric current can flow from an anode to a cathode and no electric current can flow from the cathode to the anode normally, and when a predetermined voltage is applied to agate, the path between the anode and cathode becomes non conductive, can be exemplified.

In this way, according to the light control apparatus 2 in the first embodiment, the electric discharge prevention from the light source 1 can be realized by a simple constitution to add a rectification circuit further to the above mentioned effects, it enables the downsizing and cost reduction of the light control apparatus 2.

In addition, although the step-down chopper circuit is exemplified for the electric current output circuit 5, the electric current output circuit 5 is not limited to the step-down chopper circuit, a direct electric current source which enables to flow an electric current of a predetermined intensity to the light source 1 may be used. In addition, the lighting appliance shown in FIGS. 1A and 1B is an embodiment of the present invention, and it is not intended to limit the present invention to the embodiment, and modification may be acceptable in a scope not to divagate the gist of the present invention. The same goes for second and third embodiments described below.

Second Embodiment

Subsequently a light control apparatus and a lighting appliance using the same in accordance with a second embodiment of the present invention are described. In the second embodiment, it is different that a thyristor 71 is used as an electric discharge prevention circuit in a constitution of a light control apparatus 2 instead of the diode 70, and switching ON/OFF control of the thyristor 71 is performed by a light control unit 6a. The other constitution is the same as that in the first embodiment, the same elements are designated by the same symbols, and thus, the description of them is omitted.

The thyristor 71 is set between a light control circuit 6 and a light source 1 in a manner so that an anode thereof is connected to an output terminal of the light control circuit 6 and a cathode thereof is connected to the light source, respectively. In addition, a gate of the thyristor 71 is connected to a light control unit 6a. In the thyristor 71, a path between the anode and the cathode is not conducted until a predetermined voltage is applied to the gate, and when the predetermined voltage is applied to the gate (switched on), electric current is flown from the anode to the cathode, similar to the diode.

Figure 9A:
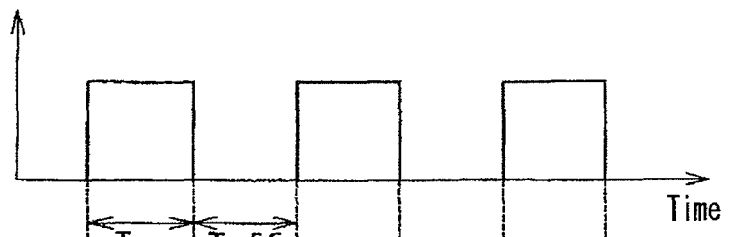
FIG. 9A is a timing chart showing variation of voltage applied to a gate of a switching element Q3 in FIG. 8.
Figure 9B:
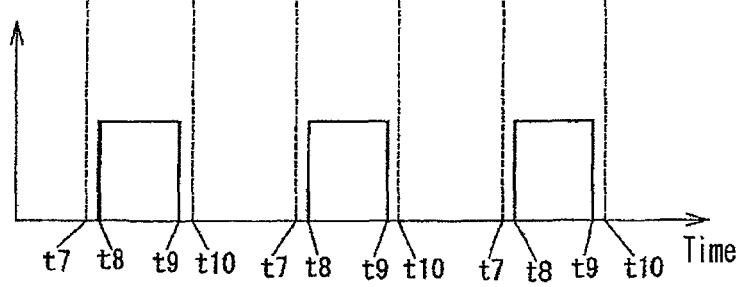
FIG. 9B is a timing chart showing variation signals (voltage) inputted into a gate of a thyristor 71 in FIG. 8.

The light control unit 6a in the second embodiment performs ON/OFF control of the switching element Q3 and further performs ON/OFF control of the thyristor 71. Hereupon, the light control unit 6a shifts a timing to apply a voltage to the gate of the switching element Q3 from a timing to apply a voltage to the gate of the thyristor 71 as shown in FIGS. 9A and 9B. Specifically, the thyristor 71 is switched on (at a time t8) passing a predetermined time (several μ to several tens μ sec, for example) after switching on the switching element Q3 (at a time t7), and the switching element Q3 is switched off (at a time t10) passing a predetermined time (several μ to several tens μ sec, for example) after switching off the thyristor 71. In addition, FIG. 9A shows waveforms of signals (voltage) inputted into the gate of the switching element Q3, and FIG. 9B shows waveforms of signals (voltage) inputted into the gate of the thyristor 71.

Subsequently, an operation of the light control apparatus 2 in the second embodiment id described. When the light control apparatus 2 starts the operation thereof, the light control unit 6a applies a voltage to the gate of the switching element Q3 with a duty ratio applied from an external apparatus so as to perform the ON/Off control (PWM control) of the switching element Q3 as shown in FIG. 9A, a constant electric current is intermittently flown in the light source 1. Thereby, the light source 1 is lit with a brightness corresponding to the above duty ratio. During such light control, when the switching element Q3 is switched off, no electric current flows from the output terminal of the light control circuit 6 to the light source 1, so that the light source 1 tries to discharge electric charge which is charged in a capacitive component of the organic EL device, however, since the thyristor 71 serving as the electric discharge prevention circuit is switched off prior to the switching off of the switching element Q3, the electric discharge from the light source 1 is prevented, In this way, according to the light control apparatus 2 and the lighting appliance using the same in the second embodiment, when a capacitive component of the organic EL device is once charged in the light control, the electric discharge is prevented by switching off of the thyristor 71 serving as the electric discharge prevention circuit, and thus, even when the switching element Q3 of the light control apparatus 2 is repeatedly switched on and off, loss of the electric power supplied to the light source 1 can be reduced and luminous efficiency can be increased, similar to the above mentioned first embodiment. In addition, the organic EL device immediately emits light responding to switching on of the switching element Q3, so that rising-up of light flux of the light source can be precipitous, and thus, brightness of light emission of a lighting appliance using this light control apparatus can be increased. In addition, surge electric currents due to charge and discharge of the capacitive component do not repeatedly flow in the organic EL device, so that stress loaded on the organic EL device can be reduced and the operative life of the light source can be elongated.

In addition, since the switching element Q3 is switched on prior to switching on the thyristor 71 and the thyristor 71 is switched off prior to switching off of the switching element Q3, no electric current flows in a path between the drain and the source of the switching element Q3 when ON and OFF of the switching element Q3 is switched, and thus, it is possible to perform soft switching of the switching element Q3 and to reduce switching loss.

Besides, although the electric discharge prevention circuit which is constituted by the thyristor 71 and the light control unit 61 for controlling the thyristor 71 is exemplified in the second embodiment, a switch which can cut off electric current surely in off state may be used instead of the thyristor 71. As for an example of such a switch, a noncontact relay such as a photo-MOS relay, or a mechanical relay (called mechanical-type relay or relay having contacts) is exemplified. In addition, the control of the thyristor 71 is not necessarily performed by the light control unit 6a, it is sufficient to perform ON/OFF control of the thyristor 71 so that the switching element Q3 is switched on prior to switching on the thyristor 71 and the thyristor 71 is switched off prior to switching off of the switching element Q3.

Third Embodiment

Figure 10:
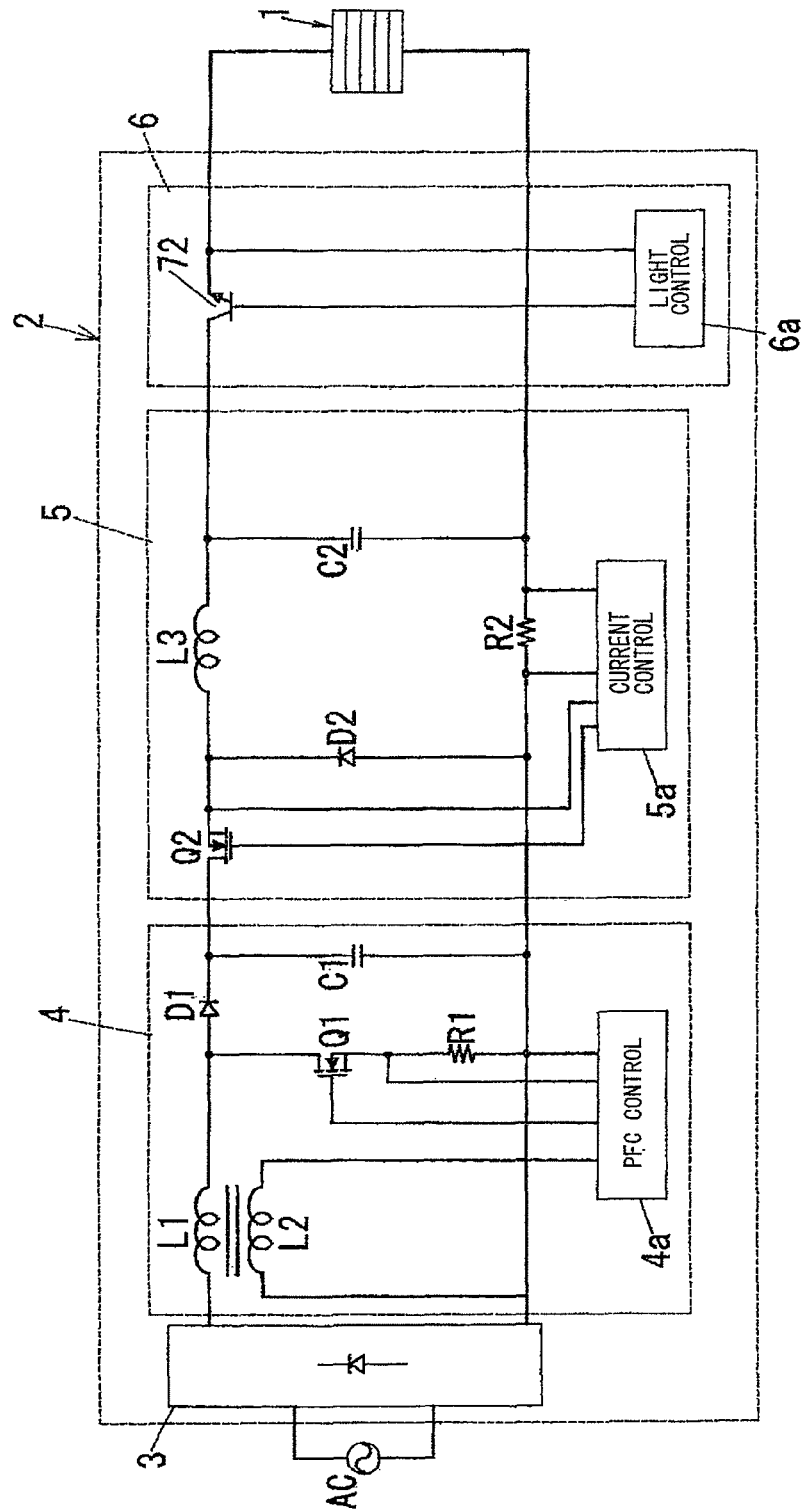
FIG. 10 is a circuit diagram showing a constitution of a light control apparatus in a third embodiment of the present invention.
Figure 11:
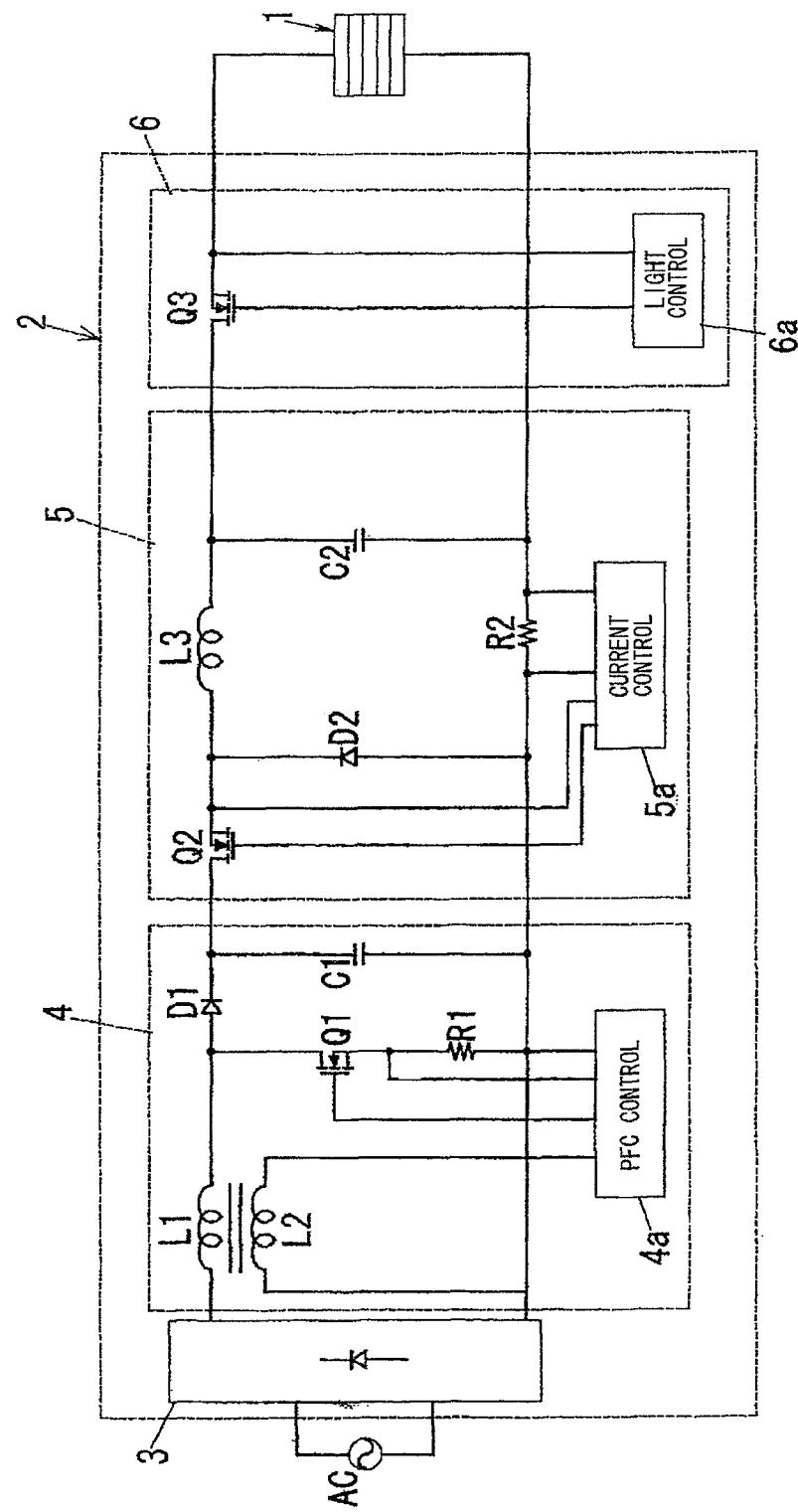
FIG. 11 is a circuit diagram showing a constitution of a conventional light control apparatus.

Subsequently a light control apparatus and a lighting appliance using the same in accordance with a third embodiment of the present invention are described. In the third embodiment, a constitution of a light control circuit 6 is different from that in the above mentioned first embodiment, as shown in FIG. 10. The other constitution is the same as that in the first embodiment, the same elements are designated by the same symbols, and thus, the description of them is omitted.

The light control circuit 6 in the third embodiment is constituted by a bipolar transistor 72 of n-p-n type, a collector of which is connected to a high electric potential side of a capacitor C2 of an electric current output circuit 5 and an emitter of which is connected to a light source 1, and a light control unit 6a which performs ON/OFF control of the bipolar transistor 72. The light control unit 6a applies a voltage between a base to an emitter of the bipolar transistor 72 based on applied duty ratio so as to perform ON/OFF control of the bipolar transistor 72 in a high frequency, and thus, performing light control of the light source 1 by outputting electric current intermittently to the light source 1. In other words, the light control circuit 6 is largely different from that in the first embodiment in terms of using the bipolar transistor 72 instead of the switching element Q3 which is a MOSTET of n-channel type.

Subsequently, an operation of the light control apparatus 2 in the third embodiment id described. When the light control apparatus 2 starts the operation thereof, the light control unit 6a applies a voltage between the base and the emitter of the bipolar transistor 72 with a duty ratio applied from an external apparatus so as to perform the ON/Off control (PWM control) of the bipolar transistor 72, and a constant electric current is intermittently flown in the light source 1. Thereby, the light source 1 is lit with a brightness corresponding to the above duty ratio. During such light control, when the bipolar transistor 72 is switched off, no electric current flows from the output terminal of the light control circuit 6 to the light source 1, so that the light source 1 tries to discharge electric charge which is charged in a capacitive component of the organic EL device.

Hereupon, since the bipolar transistor 72 has a p-n junction similar to the diode, electric current never flows in an opposite direction (from the emitter to the collector in case of n-p-n type) to the direction of electric current flow in switched on state (from the collector to the emitter in case of n-p-n type), other than the field effect transistor (unipolar transistor) such as a MOSFET in the first embodiment.

Therefore, in the light control apparatus 2 in the third embodiment, electric discharge of the light source 1 is prevented by the bipolar transistor 72 (equivalent of the switching element Q3) constituting the light control circuit 6. In other words, in the light control apparatus 2 in the third embodiment, the bipolar transistor 72 serves as the electric discharge prevention circuit for preventing electric discharge of the light source 1.

In this way, according to the light control apparatus 2 and the lighting appliance using the same in the third embodiment, they produce the same effects as those in the above mentioned first embodiment, and since the bipolar transistor 72 which constitutes the light control circuit 6 serves as the electric discharge prevention circuit, it is further possible to downsizing and cost reduction of the light control apparatus 2.

Besides, in the light control apparatus 2 in the third embodiment, although the bipolar transistor 72 of n-p-n type is exemplified as the electric discharge prevention circuit, the present invention in not limited to this embodiment, and the same effects can be obtained even when a bipolar transistor of p-n-p type, or an insulated gate bipolar transistor (IGBT) is used.

This application is based on Japanese patent application 2007-248161 filed in Japan, the contents of which are hereby incorporated by references of the specification and drawings of the above patent application.

In addition, although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

The invention claimed is:

1. A light control apparatus, comprising:
   an electric current output circuit which outputs a constant electric current for lighting a light source configured of an organic electroluminescence device;
   a light control circuit which performs light control of the light source by intermittently supplying the constant electric current outputted from the electric current output circuit; and
   an electric discharge prevention circuit which is set between an output terminal of the light control circuit and the light source and which prevents electric discharge of an electric charge charged in a capacitive component of the organic electroluminescence device,
   wherein the electric discharge prevention circuit is connected to the light source without any other electric elements being connected to the output terminal of the light control circuit.

2. The light control apparatus in accordance with claim 1, wherein the electric discharge prevention circuit is a rectification circuit and constituted so as to pass an electric current from the output terminal of the light control circuit to the light source, and to shut off an electric current from the light source to the output terminal of the light control circuit.

3. The light control apparatus in accordance with claim 2, wherein the rectification circuit is constituted by a single diode.

4. The light control apparatus in accordance with claim 2, wherein the rectification circuit is constituted by a thyristor diode.

5. The light control apparatus in accordance with claim 2, wherein the rectification circuit is constituted by a gate turn off thyristor.

6. The light control apparatus in accordance with claim 2, wherein the rectification circuit is constituted by a bipolar transistor, and the light control circuit performs light control of the light source by performing ON/OFF control of the bipolar transistor.

7. The light control apparatus in accordance with claim 2,
wherein the rectification circuit is constituted by an insulated gate bipolar transistor, and
the light control circuit performs light control of the light source by performing ON/OFF control of the insulated gate bipolar transistor.

8. A lighting appliance, comprising:
a light control apparatus;
a light source constituted by an organic electroluminescence device; and
a casing containing the light control apparatus and the light source,
wherein the light control apparatus comprises:
 an electric current output circuit which outputs a constant electric current for lighting the light source configured of the organic electroluminescence device;
 a light control circuit which performs light control of the light source by intermittently supplying the constant electric current outputted from the electric current output circuit; and
 an electric discharge prevention circuit, which is set between an output terminal of the light control circuit and the light source and which prevents electric discharge of an electric charge charged in capacitive component of the organic electroluminescence device, the electric discharge prevention circuit being connected to the light source without an other electric elements being connected to the output terminal of the light control circuit.

9. The lighting appliance in accordance with claim 8,
wherein the electric discharge prevention circuit is a rectification circuit, and constituted so as to pass an electric current from the output terminal of the light control circuit to the light source, and to shut off an electric current from the light source to the output terminal of the light control circuit.

10. The lighting appliance in accordance with claim 9,
wherein the rectification circuit is constituted by a single diode.

11. The lighting appliance in accordance with claim 9,
wherein the rectification circuit is constituted by a thyristor diode.

12. The lighting appliance in accordance with claim 9,
wherein the rectification circuit is constituted by a gate turn off thyristor.

13. The lighting appliance in accordance with claim 9,
wherein the rectification circuit is constituted by a bipolar transistor, and
the light control circuit performs light control of the light source by performing ON/OFF control of the bipolar transistor.

14. The lighting appliance in accordance with claim 9,
wherein the rectification circuit is constituted by an insulated gate bipolar transistor, and
the light control circuit performs light control of the light source by performing ON/OFF control of the insulated gate bipolar transistor.

* * * * *